(12) United States Patent
Doyle et al.

(10) Patent No.: US 6,310,400 B1
(45) Date of Patent: *Oct. 30, 2001

(54) APPARATUS FOR CAPACITIVELY COUPLING ELECTRONIC DEVICES

(75) Inventors: Brian Doyle, Cupertino; Quat T. Vu, Santa Clara; David B. Fraser, Danville, all of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/999,020

(22) Filed: Dec. 29, 1997

(51) Int. Cl.⁷ .......................... H01L 23/48; H01L 23/52; H01L 29/40
(52) U.S. Cl. ............................. 257/777; 257/532
(58) Field of Search .................... 257/777, 532, 257/535, 501, 506, 516, 686, 304

(56) References Cited

U.S. PATENT DOCUMENTS 5,818,112 * 10/1998 Weber et al. ................. 257/777

OTHER PUBLICATIONS

Williams, R., Marsh, O., "Future WSI Technology: Stacked Monolithic WSI", IEEE Transactions on CHMT, vol. 16, No. 7, Nov. 1993, pp. 610–614.

Val, C., Leroy, M., "The 3D Interconnection–Applications for Mass Memories and Microprocessors", Proc. 24th Symp. on ISHM, 1991, pp. 62–68.

W.P. Maszara; Wafer Bonding: SOI, Generalized Bonding, and New Structures; Microelectronic Engineering, vol. 299–306, 1993.

* cited by examiner

*Primary Examiner*—Sheila V. Clark
(74) *Attorney, Agent, or Firm*—Blakely, Sokoloff, Taylor & Zafman LLP

(57) ABSTRACT

A method and apparatus for capacitively coupling the input and output terminals of two semiconductor devices.

24 Claims, 6 Drawing Sheets

APPARATUS FOR CAPACITIVELY COUPLING ELECTRONIC DEVICES

FIELD OF THE INVENTION

The present invention relates generally to integrated circuits, and more particularly to a method and apparatus for communicating between two integrated circuits.

BACKGROUND OF THE INVENTION

A basic problem occurring in digital system design is that of how to speed-up throughput and reduce the delays involved in providing access to memory data and instructions. The performance of the system is dependent on the best or higher speed of access to memory data and thus is reduced by the liability of any delays that a processor would have to access data or instructions.

Typically, one technique to reduce memory cycle time is that of using a cache memory which is located adjacent to the processing unit. The adjacent cache memory has generally a high-speed fast memory data access cycle and functions to hold the more frequently used data so that it will be readily available to the processing unit.

In microprocessor performance there is a fine line that needs to be drawn between the amount of on-chip and off-chip cache. The choice is between sacrificing real estate on a microprocessor for cache (which decreases microprocessor functionality), and the performance hit due to the time taken to access off-chip memory when a "miss" occurs (i.e. when the information being looked for is not in the on-chip cache). Typically, to have to go off-chip to memory requires as much as 100 clock cycles.

What is needed is a method and apparatus that decreases the amount of time required for off-chip cache access.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

A method and apparatus for electrically coupling integrated circuits is described. In the following description, specific details are set forth in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention. This discussion will mainly be limited to those needs associated with coupling a memory device to the backside of an integrated circuit. It will be recognized, however, that such focus is for descriptive purposes only and that the apparatus and methods of the present invention are applicable to other types of electronic devices.

Figure 1A:
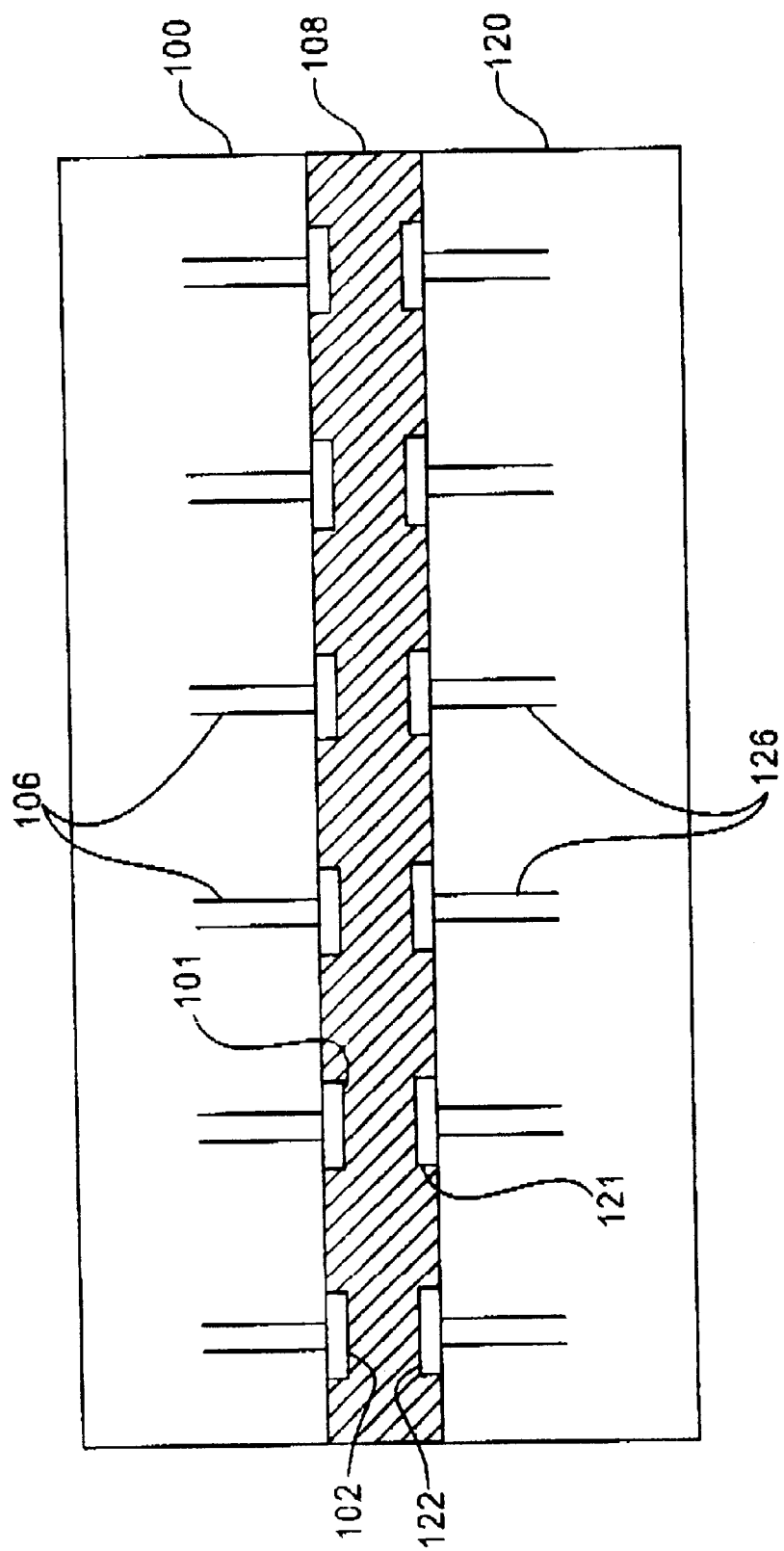
FIG. 1A illustrates one embodiment of the present invention wherein the input and output pads of two semiconductor devices are capacitively coupled.
Figure 2:
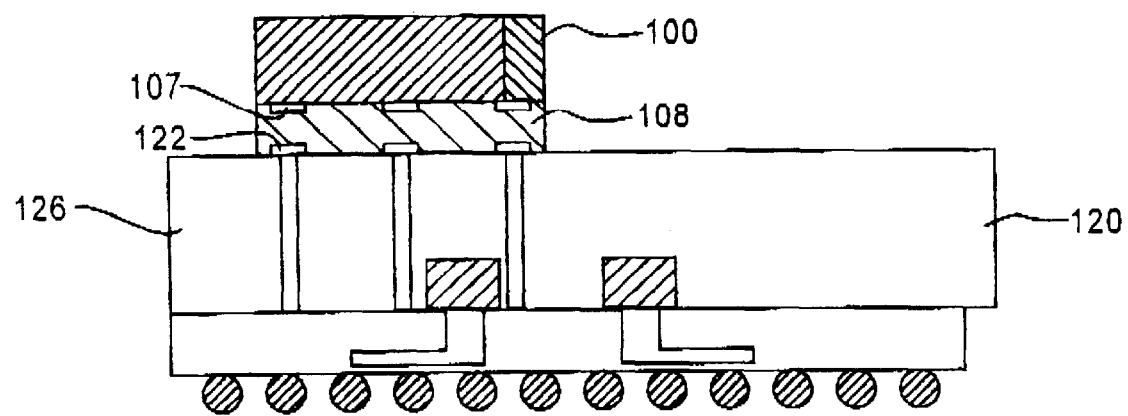
FIG. 2 shows a memory device being capacitively coupled to a microprocessor.

FIG. 1A illustrates a cross-section view of two integrated circuits 100 and 120 that are capacitively coupled. Integrated circuit 100 includes a plurality of input terminals 101 and output terminals 102 located on a surface 104 of the device. Vias 106 couple terminals 102 to circuitry (not shown) located within integrated circuit 100. Likewise, integrated circuit 120 contains a plurality of input terminals 121 and output terminals 122 along a surface 124 of the device. Terminals 101, 102, 121 and 122 generally comprise electrically conductive contact pads. In one embodiment terminals 101, 102, 121 and 122 comprise metal pads, such as aluminum or copper pads. In another embodiment, the pads may comprise a conductive oxide. Vias 126 connect terminals 121 and 122 to circuitry (not shown) located within integrated circuit 120. The input and output terminals of integrated circuits 100 and 120 are separated by a dielectric material 108. In one embodiment, dielectric material 108 includes silicon dioxide. Any of a number of other high dielectric constant materials such as Borium, strontium titanate, may also be used. The metal-insulator-metal configuration of the interconnection structure forms a capacitor. The capacitor permits a signal generated in either of integrated circuits 100 or 120 to be transferred to the other integrated circuit. In one embodiment, communication between an output terminal 102 of integrated circuit 100 and an input terminal 121 of integrated circuit 120 is achieved by generating a voltage spike at output terminal 102 to induce a corresponding voltage spike at input terminal 121. It is to be understood that terminals 101,102,121 and 122 may be made from any of a variety of metals. Moreover, it is appreciated that the dielectric material 108 is not limited to any specific dielectric. In one embodiment, integrated circuit 100 is a memory device, such as a cache memory device, and integrated circuit 120 is a microprocessor as shown in FIG. 2.

Figure 1B:
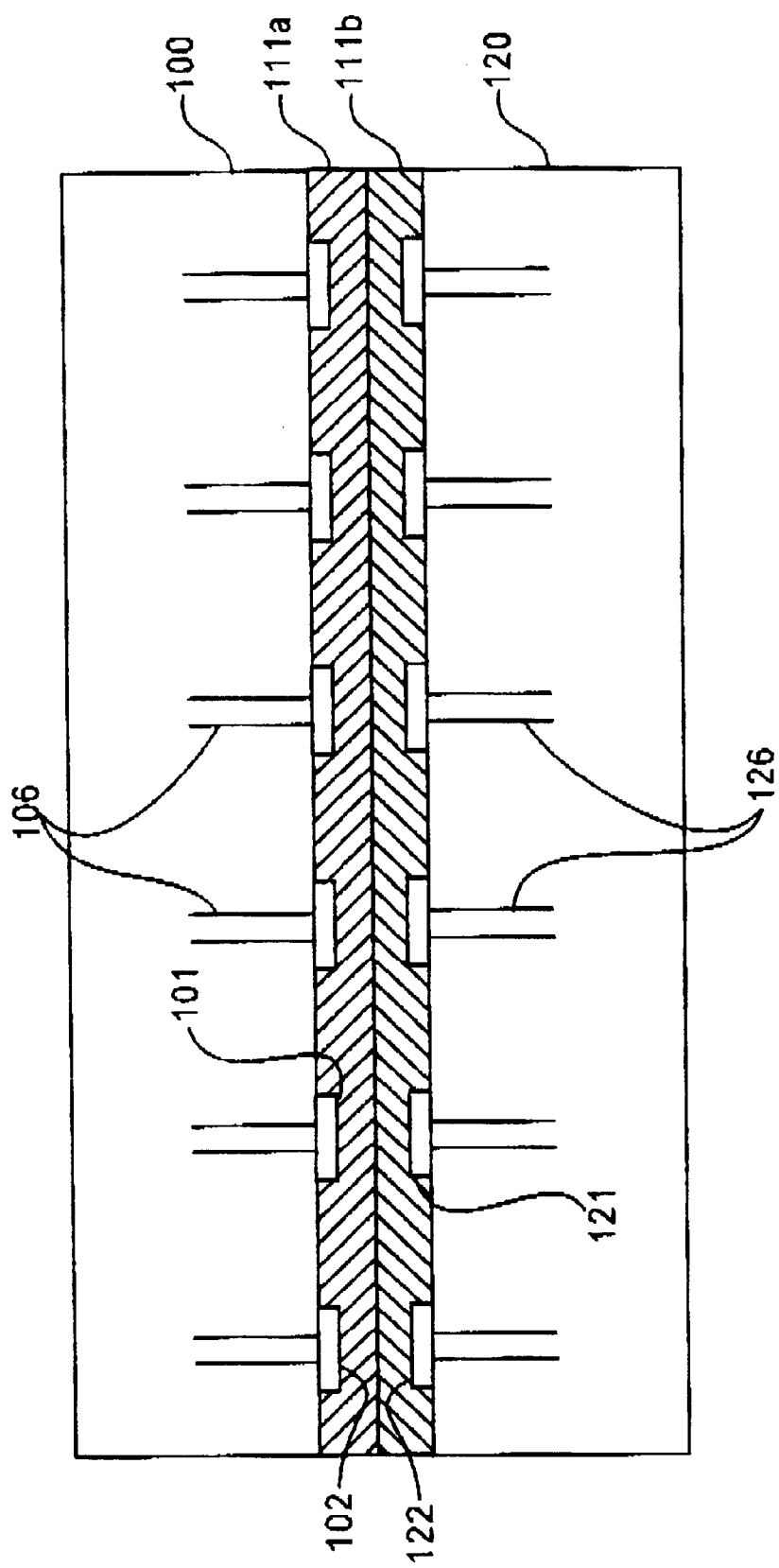
FIG. 1B illustrates one embodiment of the present invention wherein the input and output pads of two semiconductor devices are separated by multiple dielectric layers.

Although FIG. 1A shows the dielectric material being represented by a single dielectric layer, it is to be understood that multiple dielectric layers may be used in lieu of a single dielectric layer. FIG. 1B shows a connection wherein two dielectric layers 111a and 111b are provided between the input and output terminals of devices 100 and 102. It is appreciated that the present invention is not limited to any specific dielectric material nor to the number of dielectric layers separating the terminals of the devices being coupled.

Therefore, in accordance with one embodiment of the invention a first set of electrically conductive contact pads located on a first substrate may be electrically coupled to a second set of electrically conductive contact pads on a second substrate by first depositing a dielectric material of a given thickness over at least one set of electrically conductive pads and attaching the substrates such that the first and second set of pads are substantially aligned parallel to one another and such that the dielectric material is disposed between the first and second set of electrically conductive pads.

Figure 3:
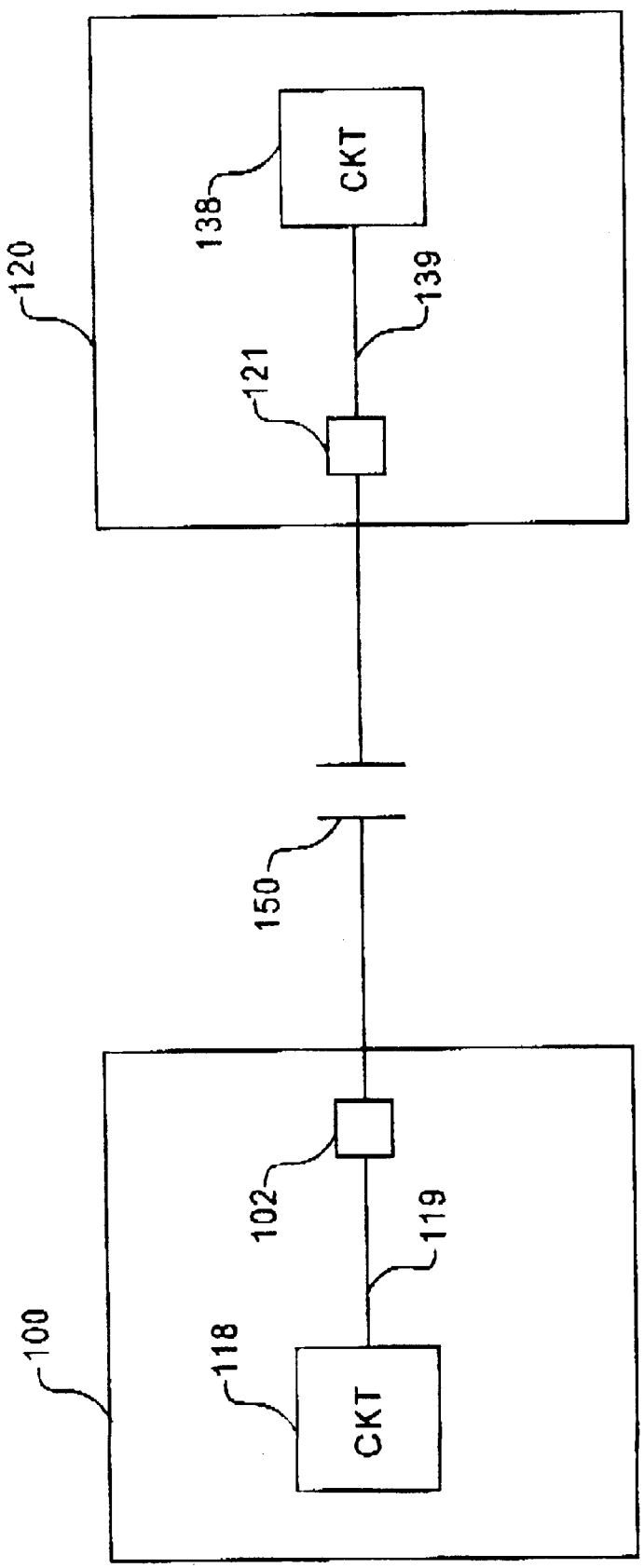
FIG. 3 illustrates a schematic diagram in one embodiment of the present invention.

FIG. 3 is a schematic diagram that represents the electrical interconnection between circuits 118 and 138 located within integrated circuits 100 and 120, respectively. As illustrated, an output terminal 102 is electrically coupled to circuit 118 by a metal interconnect 119. Likewise, input terminal 121 of integrated circuit 120 is electrically coupled to circuit 138 by a metal interconnect 139. In FIG. 3, a capacitor is shown to represent the capacitance of the capacitor formed by output terminal 102, input terminal 121, and dielectric material 108.

Figure 4:
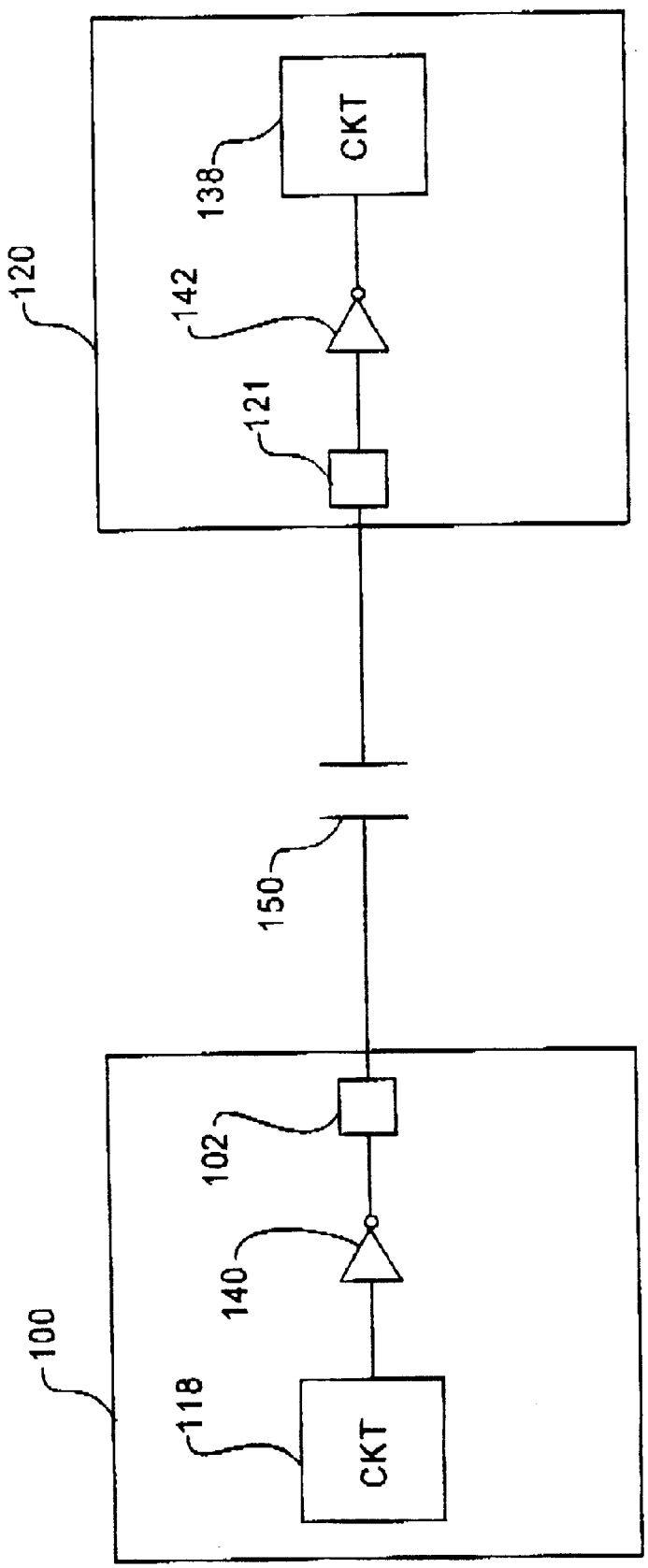
FIG. 4 illustrates an electrical diagram of another embodiment of the present invention.
Figure 5:
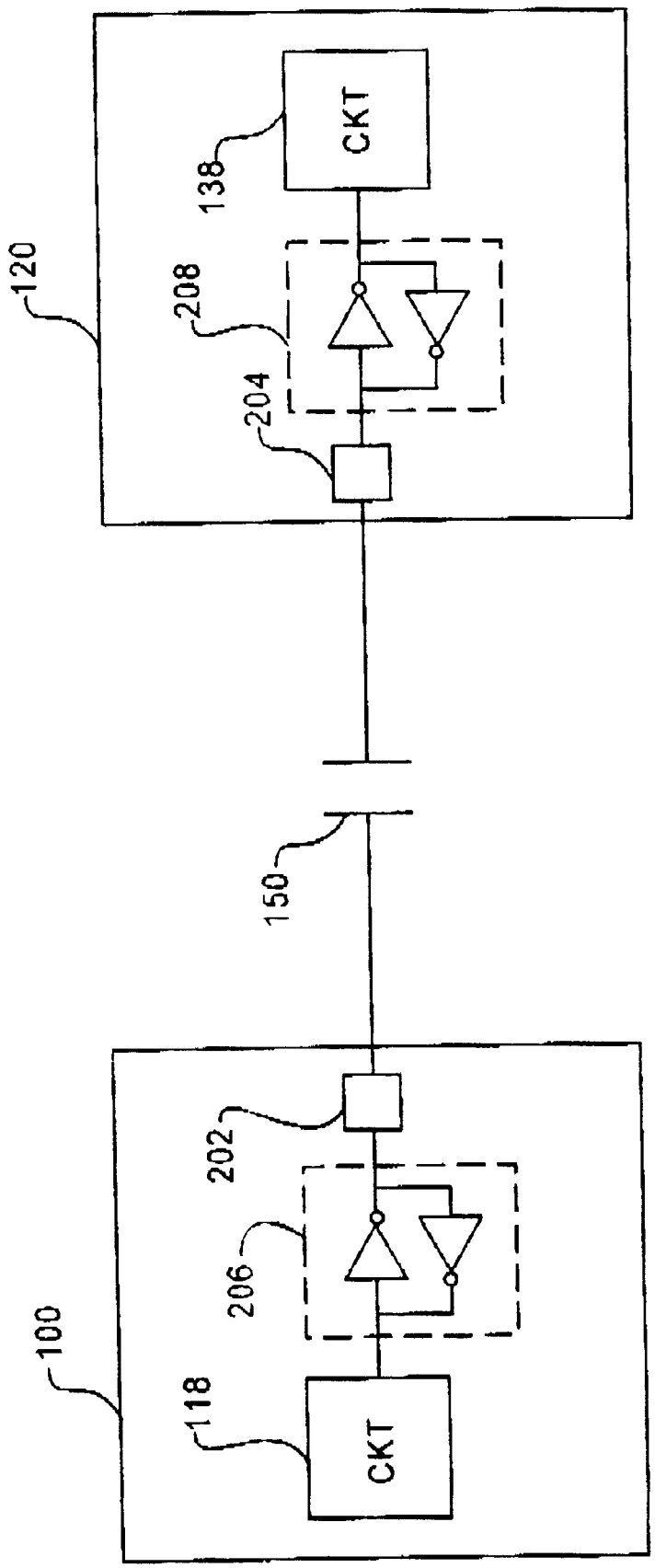
FIG. 5 illustrates an electrical diagram of yet another embodiment of the present invention.

In FIG. 4, output terminal 102 and input terminal 121 are shown including a driver 140 and a receiver 142, respectively. Driver 140 includes circuitry for ramping the voltage at output terminal 102 at a slew rate to produce a voltage spike at terminal 102. In one embodiment, receiver 142 includes a flip-flop that acts to convert the voltage signal at input terminal 121 to a digital signal. Pursuant to the embodiment of FIG. 3, an output voltage signal is generated by circuit 118. The output voltage signal is received by driver 140 which acts on the output voltage signal by ramping the signal at a slew rate to produce a first voltage spike at output terminal 102. Since input terminal 121 of integrated circuit 120 is capacitively coupled to output terminal 102, a second voltage spike is produced at input terminal 121. The second voltage spike serves as an input to receiver 142. Receiver 142 is configured such that the state output of the receiver is changed when the voltage signal at input terminal 121 transitions from a high state to a low state, or visa versa. Thus, in effect, a digital signal is transferred across capacitor 150.

Communication between an output terminal 122 of integrated circuit 120 and an input terminal 101 of integrated circuit 100 is established in the same manner as described above.

The rate at which a voltage signal is produced at the output of capacitor 150 in response to a change in the voltage signal at the input of the capacitor is dependent upon the capacitance value of the capacitor. As the value of the capacitance increases, the responsiveness of the capacitor's output voltage to the capacitor's input voltage also increases. The capacitance value of capacitor 150 is directly related to the size of the integrated circuits input and output pads and the dielectric constant of the material disposed between the input and output pads. The present invention provides an advantage over existing communication structures by permitting the use of smaller input and output pads. In accordance with the present invention, the size of the input and output pads may be decreased without materially affecting the responsiveness of the communication structure by increasing the dielectric constant of the material positioned between the input and output pads. The ability to decrease the input and output terminal pad sizes permits a greater number of input and output terminals to be placed on the integrated circuit devices. It is appreciated that the present invention is not limited to any specific input or output pad geometry. For example, in one embodiment the pads may have a circular shape, whereas in an alternative embodiment the pads may have a rectangular shape.

In the foregoing description, integrated circuits 100 and 120 have been described as having a plurality of input terminals and output terminals. It is appreciated, however, that one or more of the terminals may function as both an input terminal and an output terminal. In FIG. 4, integrated circuit 100 is shown having an input/output terminal 202 that is electrically coupled to circuit 118 by an input/output buffer 206. Integrated circuit 120 also includes an input/output terminal 204 that is electrically coupled to circuit 138 by an input/output buffer 208. Input/output terminals 202 and 204 are capacitively coupled, thereby permitting a voltage signal to be transferred across capacitor 150 in either direction. That is, a voltage signal initiated within circuit 118 may be transferred from terminal 202 to terminal 204. Conversely, a voltage signal produced in circuit 138 may be transferred from terminal 204 to terminal 202.

Thus, what has been described is an apparatus and method for communicating between two or more electronic components. In the foregoing detailed description, the apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An apparatus comprising:
   a first integrated circuit in a first chip, said first integrated circuit having an output terminal; and
   a second integrated circuit in a second chip, said first and second chips being separate electronic components wherein one of said separate electronic components comprises a microprocessor and the other of said electronic components comprises a cable memory device, said second integrated circuit having an input terminal, said input and output terminals being capacitively coupled.

2. The apparatus of claim 1 wherein said input and output terminals comprise first and second electrically conductive pads, respectively.

3. The apparatus of claim 2 wherein said first and second electrically conductive pads are aligned substantially parallel to one another.

4. The apparatus of claim 3 further comprising a dielectric material disposed between said first and second electrically conductive pads.

5. An apparatus comprising:
   a first integrated circuit in a first chip, said first integrated circuit having an output driver;
   a second integrated circuit in a second chip, said first and second chips being separate electronic components wherein one of said separate electronic components comprises a microprocessor and the other of said electronic components comprises a cache memory device, said second integrated circuit having an input receiver; and
   a capacitor serially coupling said output driver and said input receiver.

6. The apparatus of claim 5 wherein said output driver comprises a first electrically conductive pad and said input receiver comprises a second electrically conductive pad.

7. A semiconductor apparatus comprising:
   a first integrated circuit in a first chip, said first integrated circuit having an output pad comprising a first electrically conductive pad;
   a second integrated circuit in a second chip, said first and second chips being separate electronic components wherein one of said separate electronic components comprises a microprocessor and the other of said electronic components comprises a cache memory device, said second integrated circuit having an input pad comprising a second electrically conductive pad; and
   a dielectric material disposed between said first and second electrically conductive pads.

8. The apparatus of claim 7 wherein said first and second electrically conductive pads comprise a metal.

9. The apparatus of claim 7 wherein said dielectric material comprises silicon dioxide.

10. An apparatus comprising:
    first integrated circuit in a first chip, said first integrated circuit having a first plurality of input and output terminals disposed on a first surface of said first chip, said terminals comprising a first set of electrically conductive pads;

a second integrated circuit in a second chips, said first and second chips being separate electronic components wherein one of said separate electronic components comprises a microprocessor and the other of said electronic components comprises a cache memory device, said second integrated circuit having a second plurality of input and output terminals disposed on a second surface of said second chip, said terminals comprising a second set of electrically conductive pads, said second chip being attached to said first chip such that said first set of electrically conductive pads is substantially aligned with said second set of electrically conductive pads, said first and second set of electrically conductive pads being substantially parallel; and a dielectric material disposed between said first and second set of electrically conductive pads.

11. The apparatus of claim 7 wherein said dielectric material comprises Barium titanate.

12. An apparatus comprising:

a microprocessor having a first circuit, said first circuit having a first terminal; and a cache memory device located on a separate electronic component than said microprocessor, said cache memory device having a second circuit, said second circuit having a second terminal, and said first and second terminals being capacitively coupled.

13. The apparatus of claim 12 wherein said first and second terminals comprise first and second electrically conductive pads, respectively.

14. The apparatus of claim 13 wherein said first and second electrically conductive pads are aligned substantially parallel to one another.

15. The apparatus of claim 14 further comprising a dielectric material disposed between said first and second electrically conductive pads.

16. The apparatus of claim 14 wherein said first and second electrically conductive pads comprise a metal.

17. The apparatus of claim 15 wherein said dielectric material comprises silicon dioxide.

18. The apparatus of claim 15 wherein said dielectric material comprises Barium titanate.

19. The apparatus of claim 12 wherein said microprocessor has a first voltage and said cache memory device has a second voltage, said first voltage being different than said second voltage.

20. A semiconductor apparatus comprising:

a microprocessor having a first circuit, said first circuit having a first terminal;

a cache memory device located on a separate electronic component than said microprocessor, said cache memory device having a second circuit, said second circuit having a second terminal, said first and second terminals being capacitively coupled; and a dielectric material disposed between said first and second terminals.

21. The apparatus of claim 20 wherein said first and second terminals comprise electrically conductive pads.

22. The apparatus of claim 20 wherein said dielectric material comprises silicon dioxide.

23. The apparatus of claim 20 wherein said dielectric material comprises Barium titanate.

24. The apparatus of claim 20 wherein said microprocessor has a first voltage and said cache memory device has a second voltage, said first voltage being different said second voltage.

* * * * *

UNITED STATES PATENT AND TRADEMARK OFFICE
CERTIFICATE OF CORRECTION

PATENT NO.    : 6,310,400 B1
DATED         : October 30, 2001
INVENTOR(S)   : Doyle et al.

It is certified that error appears in the above-identified patent and that said Letters Patent is hereby corrected as shown below:

Column 4,
Lines 19-20, please delete "cable memory device" and insert -- cache memory device --.

Signed and Sealed this

Second Day of November, 2004

JON W. DUDAS
*Director of the United States Patent and Trademark Office*